US006348738B1

(12) United States Patent
Dery et al.

(10) Patent No.: US 6,348,738 B1
(45) Date of Patent: Feb. 19, 2002

(54) FLIP CHIP ASSEMBLY

(75) Inventors: Jean Dery, Granby (CA); Frank D. Egitto, Binghamton; Luis J. Matienzo, Endicott, both of NY (US); Charles Ouellet, Missisquoi; Luc Ouellet, Bromont, both of (CA); David L. Questad; William J. Rudik, both of Vestal, NY (US); Son K. Tran, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/371,975

(22) Filed: Aug. 11, 1999

Related U.S. Application Data

(62) Division of application No. 08/936,032, filed on Sep. 23, 1997, now Pat. No. 6,074,895.

(51) Int. Cl.[7] .......................... H01L 23/48; H01L 29/40; H01K 3/34; H01K 3/10
(52) U.S. Cl. .......................... 257/778; 257/737; 257/738; 257/734; 257/784; 257/786; 257/787; 257/777
(58) Field of Search ................................. 257/777–780, 257/737, 738, 734, 787, 784, 786

(56) References Cited

U.S. PATENT DOCUMENTS

| 3,811,183 A | 5/1974 | Celling |
| 3,930,807 A | 1/1976 | Kobayashi et al. |
| 4,536,271 A | 8/1985 | Collins |

(List continued on next page.)

FOREIGN PATENT DOCUMENTS

| JP | 5251511 | 9/1993 |
| JP | 5313392 | 11/1993 |
| JP | 6332136 | 12/1994 |
| WO | WO 96/23021 | 8/1996 |

OTHER PUBLICATIONS

White et al. "Carrier Design for Void Free Encapsulation of Flip Chip Attach," pp. 1, 3, 6, & 8 (1995).
Wong et al. "Pre–encapsulation Cleaning Methods and Control for Microelectronics Packaging," (IEEE, Part A, vol. 17, No. 4; pp. 542–552 (1994)).
Giesler et al. "Flip Chip on Board Connection Technology: Process Characterization and Reliability," (IEEE, Part B., vol. 17, No. 3; pp. 256–263 (1994)).
Matienzo et al. "Adhesion Issues in Electronic Packaging," (Solid State Technology, pp. 99, 100, 102–104, 106 (1995)).

(List continued on next page.)

Primary Examiner—Alexander O. Williams
(74) Attorney, Agent, or Firm—Ratner & Prestia; Lawrence R. Fraley, Esq.

(57) ABSTRACT

A method for forming a flip-chip-on-board assembly. An integrated circuit (IC) chip having a polyimide passivation layer is joined to a chip carrier via a plurality of solder bumps which electrically connect a plurality of contact pads on the IC chip to corresponding contacts on the chip carrier. A space is formed between a surface of the passivation layer and a surface of the chip carrier. A plasma is applied, to chemically modify the surface of the chip carrier and the passivation layer of the IC chip substantially without roughening the surface of the passivation layer. The plasma is either an $O_2$ plasma or a microwave-generated Ar and $N_2O$ plasma. An underfill encapsulant material is applied to fill the space. The plasma treatment may be performed after the step of joining. Then, the chip and chip carrier are treated with the plasma simultaneously. Alternatively, the IC chip and chip carrier may be treated with the plasma before they are joined to one another. The plasma treatment improves adhesion between the encapsulant and the IC chip, and between the encapsulant and the chip carrier.

7 Claims, 6 Drawing Sheets

U.S. PATENT DOCUMENTS

| | | | |
|---|---|---|---|
| 4,544,571 A | | 10/1985 | Miller |
| 4,936,940 A | | 6/1990 | Kawasumi et al. |
| 5,137,791 A | | 8/1992 | Swisher |
| 5,252,181 A | | 10/1993 | Dutartre et al. |
| 5,311,059 A | | 5/1994 | Banerji et al. |
| 5,371,404 A | | 12/1994 | Juskey et al. |
| 5,385,869 A | * | 1/1995 | Liu et al. |
| 5,450,283 A | | 9/1995 | Lin et al. |
| 5,457,356 A | * | 10/1995 | Parodos ............... 313/505 |
| 5,461,203 A | | 10/1995 | Blackwell et al. |
| 5,527,566 A | | 6/1996 | Schadt et al. |
| 5,542,171 A | * | 8/1996 | Juskey et al. ............. 29/840 |
| 5,600,130 A | * | 2/1997 | VanZeghbroeck ......... 257/431 |
| 5,602,059 A | | 2/1997 | Horiuchi et al. |
| 5,655,862 A | * | 8/1997 | Kato ..................... 409/231 |
| 5,656,139 A | * | 8/1997 | Corey et al. ............. 204/222 |
| 5,668,059 A | * | 9/1997 | Christie et al. .......... 438/118 |
| 5,729,896 A | * | 3/1998 | Palal et al. .............. 29/840 |
| 5,768,108 A | * | 6/1998 | Miura et al. ............. 361/792 |
| 5,795,818 A | * | 8/1998 | Marrs ..................... 438/612 |
| 5,819,406 A | * | 10/1998 | Yoshizowa et al. ......... 29/877 |
| 5,841,197 A | * | 11/1998 | Adamic, Jr. ............. 257/777 |
| 5,865,365 A | * | 2/1999 | Nishikawa et al. ........ 228/223 |
| 5,888,884 A | * | 3/1999 | Wojnarowski ............ 438/462 |
| 5,930,588 A | * | 7/1999 | Paniccia ................. 438/16 |
| 5,956,605 A | * | 9/1999 | Akram et al. ............ 438/613 |
| 5,998,228 A | * | 12/1999 | Eldridge et al. .......... 438/15 |
| 5,998,232 A | * | 12/1999 | Maruska ................. 438/46 |
| 6,002,163 A | * | 12/1999 | Wojnarowski ............ 257/620 |
| 6,015,722 A | * | 1/2000 | Banks et al. ............. 438/108 |
| 6,104,093 A | * | 8/2000 | Celetka et al. ........... 257/778 |
| 6,121,689 A | * | 9/2000 | Capote et al. ............ 257/783 |

OTHER PUBLICATIONS

Vetelino et al. "A Novel Microsensor Technique for Electronic Material Surface Characterization and Studying the Effects of Plasma Treatments," (ISHM '95 Proceedings, 7 pp.).

Amagai et al. "Polymide Surface Characteristics for Adhesion Strength at the Interface Between Polymide and Mold Resin," (IEEE, Singapore, IPFA '93, pp. 6–10).

Fazal Fazlin "Plasma Treatment for Improved Wire Bonding," (Solid State Technology, 4 pp. (Oct. 1996)).

"In–Line Plasma System" (March Instruments, Inc., 4 pp.).

M.A. Chopra "Advances in Organic Substrate Ball Grid Array Technology Using Flip Chip Attach," (1994 IEPS Conference, pp. 612–619).

M.A. Chopra "Fabrication Issues in the Development of Low Cost Flip Chip Plastic BGA Assemblies," (pp. 226–230, 232–237).

Powell et al. "Flip–Chip on FR–4 Integrated Circuit Packaging," (IBM Technology Products, 5 pp.).

Ravi Subrahmanyan "Mechanical and Accelerated Testing of Flip Chip Interconnect Systems," (1994 Materials Research Society, vol. 323, pp. 394–407).

Wolf et al., Silicon Processing for the SLSI Era, vol. 1, Lattice Press, pp. 543–544 (1986).

* cited by examiner

FLIP CHIP ASSEMBLY

This application is a divisional of U.S. patent application Ser. No. 08/936,032, filed on Sep. 23, 1997, which was issued on Jun. 13, 2000 as U.S. Pat. No. 6,074,895.

FIELD OF THE INVENTION

The present invention relates to the field of semiconductor package fabrication techniques generally, and more specifically to methods for forming flip-chip-on-board assemblies.

BACKGROUND OF THE INVENTION

One of the main challenges in electronics design is the method used to form the mechanical and electrical bonds between a semiconductor integrated circuit (IC) and the chip carrier (or printed circuit board). Wire bonding and flip-chip are two of the most well known methods. The most common of these processes is wire bonding. In wire bonding, a plurality of bonding pads are located in a pattern on the top surface of the substrate, with the chip mounted in the center of the pattern of bonding pads and with the top surface of the chip facing away from the top surface of the substrate. Fine wires (which may be aluminum or gold wires) are connected between the contacts on the top surface of the chip and the contacts on the top surface of the substrate.

The most space-efficient method for joining an IC to a chip carrier is the flip-chip-on-board (FCOB) technique, also referred to as the flip-chip technique. In the flip-chip technique, the top surface of the IC chip has an array of electrical contact pads. A solder bump is formed on each of the contact pads. The chip carrier has a corresponding grid of contacts. The chip is flipped upside down so that the solder bumps mate with solder plating on the corresponding contacts on the chip carrier (hence the name "flip-chip"). The assembly is heated to reflow the solder plating on the chip carrier contacts. The solder plating, on the chip carrier contacts, reflows to join the IC chip and chip carrier. The footprint of the FCOB assembly is very close to the footprint of the IC chip alone.

Conventional flip-chip assemblies often have reliability problems due to thermal mismatch (differential thermal expansion). This differential thermal expansion may result from two different sources. First, the coefficient of thermal expansion (CTE) of the IC chip is typically $2.5 \times 10^{-6}/°$ C., whereas the CTE for the chip carrier is typically between 20 and $25 \times 10^{-6}/°$ C. Thus, the chip and chip carrier expand by different amounts at any given temperature. Second, the temperature within the chip may not be uniform, so that different parts of the chip expand at different rates. The differential thermal expansion in various portions of the chip and between the chip and the chip carrier apply stress to the solder joints, causing solder fatigue failures.

The most common technique for reducing the thermal mismatch problem is to position an organic-based encapsulant (underfill) between the IC chip and the chip carrier. The encapsulant bonds to both the IC chip and the chip carrier, constrains the thermal mismatch, and lowers the stress on the solder joints. The primary failure mechanism in FCOB assemblies that include the encapsulant is delamination at the interface between the active face of the IC chip and the encapsulant. Once adhesion between these two surfaces is lost, the solder joints are subjected directly to the stress of the thermal mismatch between the chip and the chip carrier. Electrical failure typically occurs rapidly after delamination.

To improve the reliability of FCOB assemblies sufficiently to make flip-chip technology more common, a method of preventing delamination between the encapsulant and the surface of the chip, the chip carrier, or both is desired.

SUMMARY OF THE INVENTION

The present invention is a method for forming a flip-chip on board (FCOB) assembly, and an FCOB assembly formed using the method. A plasma is applied to chemically modify a surface of the passivation layer of an integrated circuit (IC) chip, substantially without roughening the surface of the passivation layer. The IC chip is joined to a chip carrier via a plurality of solder bumps electrically connecting a plurality of contact pads on the IC chip to corresponding contacts on the chip carrier. A space is formed between the surface of the passivation layer and a surface of the chip carrier. An underfill encapsulant material is applied to fill the space. It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

OVERVIEW

The present invention is a method for forming a flip-chip-on-board (FCOB) assembly and an FCOB assembly formed using the method. According to one aspect of the invention, a plasma is used to chemically modify a surface of a passivation layer of the IC chip substantially without roughening the surface of the passivation layer. The plasma may also be used to modify the surface of the chip carrier. The plasma treatment enhances the adhesion between the IC chip and the encapsulant in the FCOB assembly. If the chip carrier is also treated with the plasma, the adhesion between the chip carrier and the encapsulant is also enhanced. The enhanced adhesion reduces the incidence of delamination at the interfaces between the encapsulant and IC chip and between the encapsulant and the chip carrier.

In the exemplary embodiments, a plasma is used to modify the surface of an IC chip device containing a passivation layer such as polyimide. The plasma may also be used to modify the surface of an organic laminate chip carrier. Although a number of different types of gaseous plasmas may be effective, the exemplary embodiments of the invention use oxygen plasmas.

The plasma modifies the chip surface without change to the bulk properties of the passivation layer and without imparting any substantial surface roughness. The electrical properties of the device are not adversely affected. In the exemplary embodiments, the surface of the chip carrier is typically a protective coating (or procoat) also used as a solder mask. Common procoat layers are composed of resins (such as epoxy) filled with inorganic fillers to control thermal expansion coefficients. Oxygen plasmas remove some resin, exposing the inorganic filler. This serves to roughen the surface of the chip carrier and induce a more hydrophilic nature to the bonding surface. Roughening of the surface of the chip carrier improves adhesion of the assembled package. The chip carrier surface may also be roughened mechanically.

It is believed that surface treatment using plasma processes can enhance adhesion between the chip surface and the encapsulant by virtue of: (1) chemical modification of the passivation layer; (2) microroughening of the chip passivation layer; and (3) cleaning contaminants from the chip surfaces (e.g., solder flux or contaminants introduced by wafer dicing). It is further believed that the chemical modification of the passivation layer is the primary cause of the enhanced bond between the IC chip and the encapsulant. It is also believed that the adhesion between the chip carrier and the encapsulant is improved by microroughening of the chip carrier surface and chemical modification of the chip carrier surface.

DETAILED DESCRIPTION

First Example

Figure 1A:
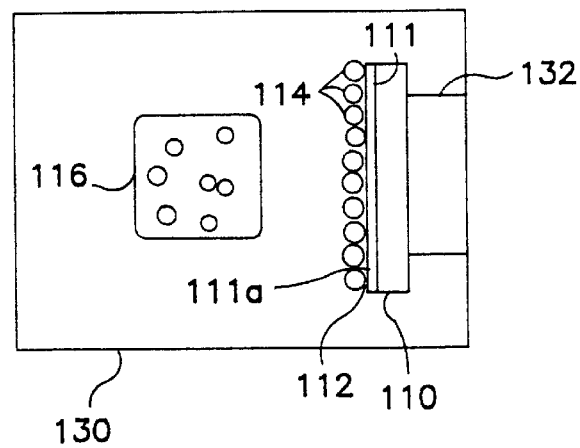
FIGS. 1A, 1D, and 1E show a first exemplary method of fabricating an FCOB assembly according to the present invention.
Figure 1B:
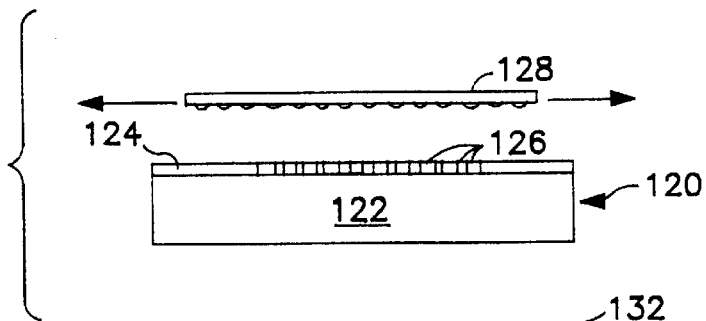
FIGS. 1B and 1C show two optional steps of treating the chip carrier, which may be performed in combination with the steps shown in FIGS. 1A, D, and 1E.
Figure 1C:
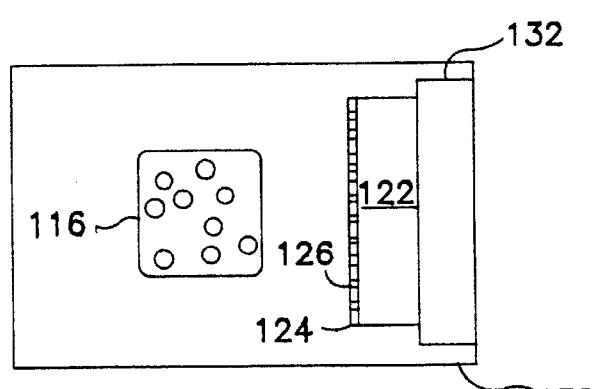
Figure 1D:
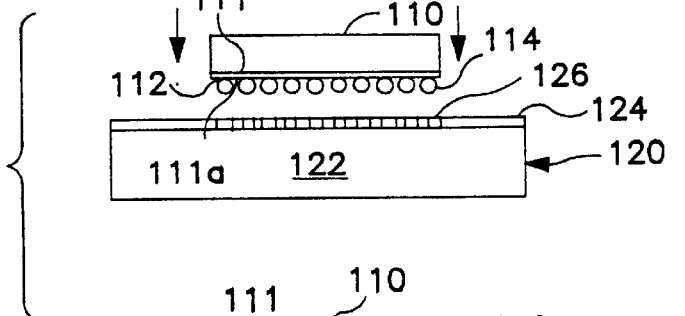
Figure 1E:
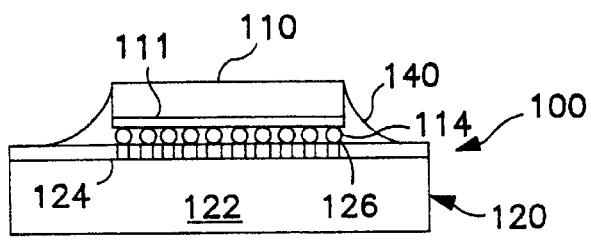

FIGS. 1A, 1D, and 1E show a first exemplary method of forming a flip-chip assembly 100 in accordance with the present invention. The exemplary embodiments of FIGS. 1A to 1E are also referred to herein as the "chip-up treatment," to indicate that the IC chip 110 and the chip carrier 120 are treated separately, before the chip 110 is "flipped" upside-down for joining the chip 110 and chip carrier 120.

FIG. 1A shows the plasma treatment being applied to an IC chip 110. The IC chip 110 has a passivation layer 111 with a surface 111a. Passivation layer 111 may consist of an organic material, such as polyimide. The IC chip 110 has a plurality of contact pads 112, with a respective solder bump 114 formed on each contact pad 112 using a conventional technique for forming a solder bump. Other materials may be used for the passivation layer. For example, the passivation layer 111 may be formed from materials that include a hydrocarbon component or other low-dielectric constant materials (such as SiN, SiO, or materials including fluorocarbons).

In FIG. 1A, a plasma chamber 130 is shown schematically. The passivation surface 111a of the chip 110 is treated in a plasma 116, which may, for example, be an oxygen ($O_2$) plasma. The plasma chamber 130 may be a reactive ion etching (RIE) system, in which the IC chip 110 is placed on an electrically driven electrode 132.

The plasma 116 is applied to chemically modify the surface 111a of the passivation layer 111 of the IC chip 110, substantially without roughening the surface 111a of the passivation layer 111. In the exemplary embodiment, the chemical modification by the plasma 116 includes oxidizing the surface 111a of the passivation layer 111. The exemplary plasma 116 is either an $O_2$ plasma or a microwave-generated Ar and $N_2O$ plasma. The roughness imparted on the passivation layer 111 is sufficiently insubstantial so that no roughness is detectable by a scanning electron microscope. As used in the present application, the term "roughening" means formation of irregularities greater than about 100 Å.

FIGS. 1B and 1C show steps which are optional and are described in detail below. FIG. 1D shows the step of joining the IC chip 110 to the chip carrier 120. The chip carrier 120 may include a laminate 122 covered by the surface 124 of the chip carrier 120. In the example shown, the surface 124 of the chip carrier 120 comprises an epoxy resin solder mask having inorganic filler particles.

The IC chip 110 is joined to the chip carrier 120 via the plurality of solder bumps 114 and the solder plating on the contacts 126 of chip carrier 120. The solder plating on the chip carrier contacts 126 reflows and establishes electrical contact between the solder bumps 114 on the IC chip 110 and corresponding contacts 126 on the chip carrier 120. The solder bumps 114 form a space between the surface 111a of the passivation layer 111 and the surface 124 of the chip carrier 120.

FIG. 1E shows the step of applying an underfill encapsulant material 140 to fill the space. A conventional encapsulant and encapsulation process may be used. A predetermined amount of encapsulant 140 is dispensed on one or more edges of IC chip 110. The encapsulant 140 is directed to flow under the IC chip 110, and is drawn into the space between IC chip 110 and chip carrier 120 by capillary action. A second encapsulant dispense pass may be used to ensure that sufficient fillets are formed on all four sides of the IC chip 110.

FIGS. 1B and 1C show two optional steps of roughening the surface 124 of the chip carrier 120 before the step of joining (shown in FIG. 1D). FIG. 1B shows a step of mechanically roughening the surface 124 of the chip carrier 120. FIG. 1C shows a step of treating the surface 124 of the chip carrier 120 with the plasma 116.

FIG. 1B shows an exemplary polishing step. Although an abrasive object 128 (such as a polishing cloth) is shown being moved back and forth across the surface of the chip carrier 120 for simplicity in the drawing, one of ordinary skill recognizes that a typical mechanical roughening step may involve immersion of the chip carrier 120 into a slurry or mixture of a liquid carrier having abrasive particles suspended in the liquid carrier.

FIG. 1C shows treatment of the chip carrier 120 in the plasma chamber 130. The same plasma 116 may be used to treat both the IC chip 110 and the chip carrier 120. The chip carrier 120 is treated with the plasma 116 to chemically modify the surface of the chip carrier 120. Because the surface 124 of the exemplary chip carrier 120 is a composite material, the plasma 116 affects the filler and the resin differently. Specifically, the plasma 116 removes some of the resin, exposing the filler. This roughens the chip carrier 120 and induces a more hydrophilic nature to the bonding surface of the chip carrier 120.

Either or both of the steps shown in FIGS. 1B and 1C may be performed in combination with the steps shown in FIGS. 1A, 1D, and 1E. In other words, the method may comprise the steps of: (1) applying the plasma 116 to the IC chip 110; (2) mechanically roughening the surface 124 of the chip carrier 120; (3) joining the chip 110 and chip carrier 120; and (4) applying the encapsulant 140. Alternatively, the method may comprise the steps of: (1) applying the plasma 116 to the IC chip 110; (2) applying the plasma 116 to the chip carrier 120; (3) joining the chip 110 and chip carrier 120; and (4) applying the encapsulant 140. Further, the method may comprise the steps of: (1) applying the plasma 116 to the IC chip 110; (2) mechanically roughening the surface 124 of the chip carrier 120; (3) applying the plasma 116 to the surface 124 of the chip carrier 120; (4) joining the chip 110 and chip carrier 120; and (5) applying the encapsulant 140. Finally, the steps shown in FIGS. 1B and 1C may be performed before or after the step shown in FIG. 1A.

Many variations of the plasma treatment may be used. For example, the IC chip 110 may reside on an electrically isolated (floating) or grounded surface in a radio-frequency (RF) plasma within the plasma chamber 130. In a further variation (not shown), the plasma may be generated using microwave frequency energy with a feed gas mixture of argon (Ar) and nitrous oxide ($N_2O$), with the assembly placed outside of the plasma region (downstream), but subjected to the reactive effluent from the plasma region.

Second Example

FIGS. 2A to 2D show a second exemplary method for forming a flip-chip assembly 200 in accordance with the present invention. In this embodiment, the step of applying the plasma 216 is performed after the step of joining and the surface 224 of the chip carrier 220 is also chemically modified. The exemplary method of FIGS. 2A to 2D is called the "chip-down treatment," indicating that the plasma treatment is performed after IC chip 210 is "flipped" upside down and joined to chip carrier 220.

Items in FIGS. 2A to 2D that correspond to the items in FIGS. 1A to 1D are identified by reference numerals having the same last two digits and, for brevity, descriptions of each item are not repeated. For example, the IC chip 210 and chip carrier 220 in FIGS. 2A to 2D correspond to the IC chip 110 and chip carrier 120, respectively, in FIGS. 1A to 1E. Laminate 222, plasma chamber 230, and electrode 232 similarly correspond to laminate 122, plasma chamber 130, and electrode 132.

Figure 2A:
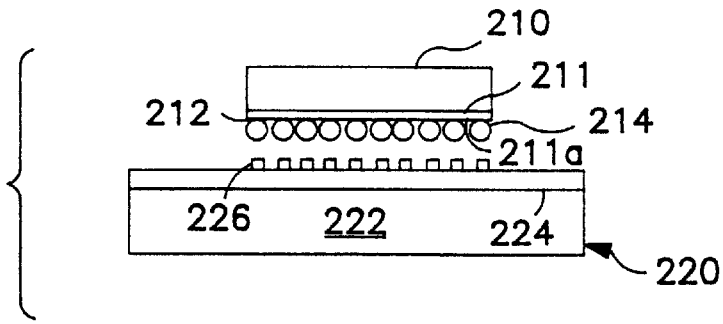
FIGS. 2A to 2D show a second exemplary method of fabricating an FCOB assembly according to the present invention.
Figure 2B:
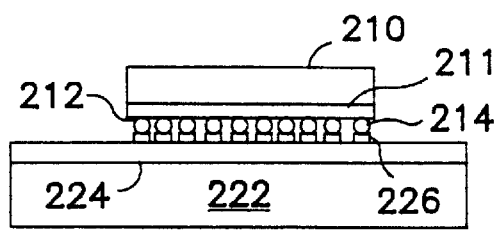

FIGS. 2A and 2B show the IC chip 210 and chip carrier 220 before joining (FIG. 2A) and after joining (FIG. 2B). The IC chip 210 has a polyimide passivation layer 211. IC chip 210 is joined to chip carrier 220 via a plurality of solder bumps 214. The solder bumps 214 electrically connect contact pads 212 on the IC chip 210 to corresponding contacts 226 on the chip carrier 220. A space is formed between a surface 211a of the passivation layer 211 and a surface 224 of the chip carrier 220.

Figure 2C:
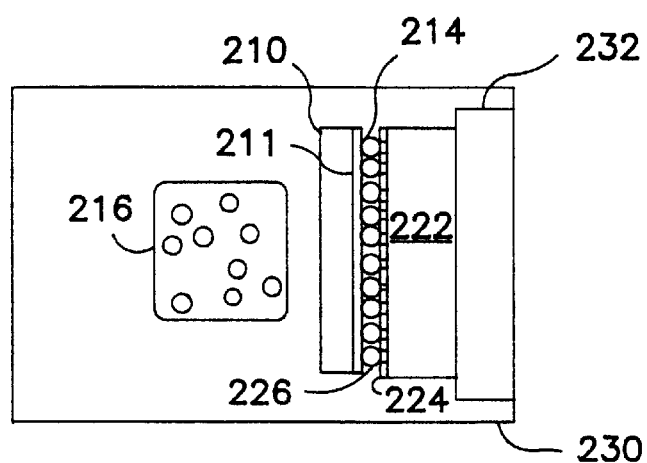
Figure 2D:
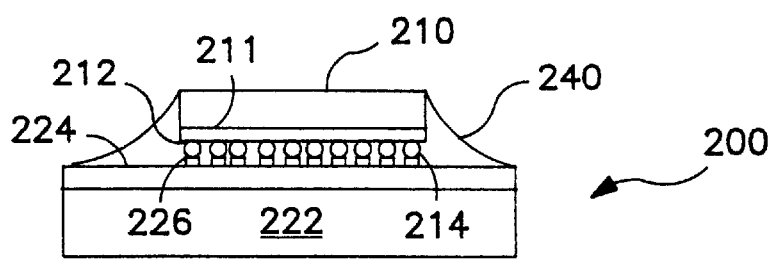

FIG. 2C shows the step of applying a plasma 216, after the step of joining, to chemically modify the surface 224 of the chip carrier 220 and the passivation layer 211 of the IC chip 210 substantially without roughening the surface 211a of the passivation layer 211. The plasma 216 may also be either $O_2$ plasma or a microwave-generated Ar and $N_2O$ plasma. FIG. 2D shows the step of applying an underfill encapsulant material 240 to fill the space. This is the same as the step shown in FIG. 1E.

Plasma treatment of the chip surface 211a at a point in the assembly process subsequent to the joining of the chip 210 to the chip carrier 220 (as shown in FIGS. 2A to 2D) reduces handling of bare chips, and simplifies part handling in general, because the ease of handling laminate carriers through plasma treatment is greater than handling of bare chips. Plasma treatment following chip joining also provides the potential for removing flux residues which remain from the joining step. Further, etching of polyimide (passivation layer 211) is greatly reduced for treatment of the flipped chip 210 (shown in FIG. 2C) when compared with treatment in which the polyimide surface 111a is directly exposed to the plasma 116 (as shown in FIG. 1A). Hence, uniformity of etching rate throughout large production type systems is less critical if the method of FIGS. 2A to 2D is followed. Further, there is no concern for oxidation of solder bumps 214 on the bare chips 210. Plasma treatment performed after joining has the potential for automated in-line assembly processing.

EXPERIMENTAL DATA

Results of plasma treatment of chips having a polyimide passivation layer and chip carriers comprising an organic laminate with an epoxy-based procoat surface are described below in Table 1. The "chip-up" and "chip-down" data are compared to results on an assembly for which neither the chip nor the laminate were treated. Tests included measurement of advancing deionized water contact angle on the (polyimide) chip surface, x-ray photoelectron spectroscopy of the (polyimide) chip surface (XPS) with the elemental composition of oxygen shown in the table, fracture toughness testing (relative adhesion values given), acoustic imaging, and thermal cycling.

TABLE 1

| Plasma Treatment | Contact Angle, Chip (Degrees) | XPS Analysis (At % 0) | Relative Adhesion (No Plasma = 100) | Thermal Cycle (min. 500 cycles; −55 to 125° C.) with acoustic imaging |
|---|---|---|---|---|
| No Plasma | 73 | 14 | 100 | – |
| Chip-Up | 5 | 24 | 350–600 | + |
| Chip-Down | 10 | 29 | 350–600 | + |

In the right-most column of Table 1, a plus (+) sign indicates that no delamination problem was detected. A minus (−) sign indicates that delamination occurred between the encapsulant and either the chip or the chip carrier.

Figure 3:
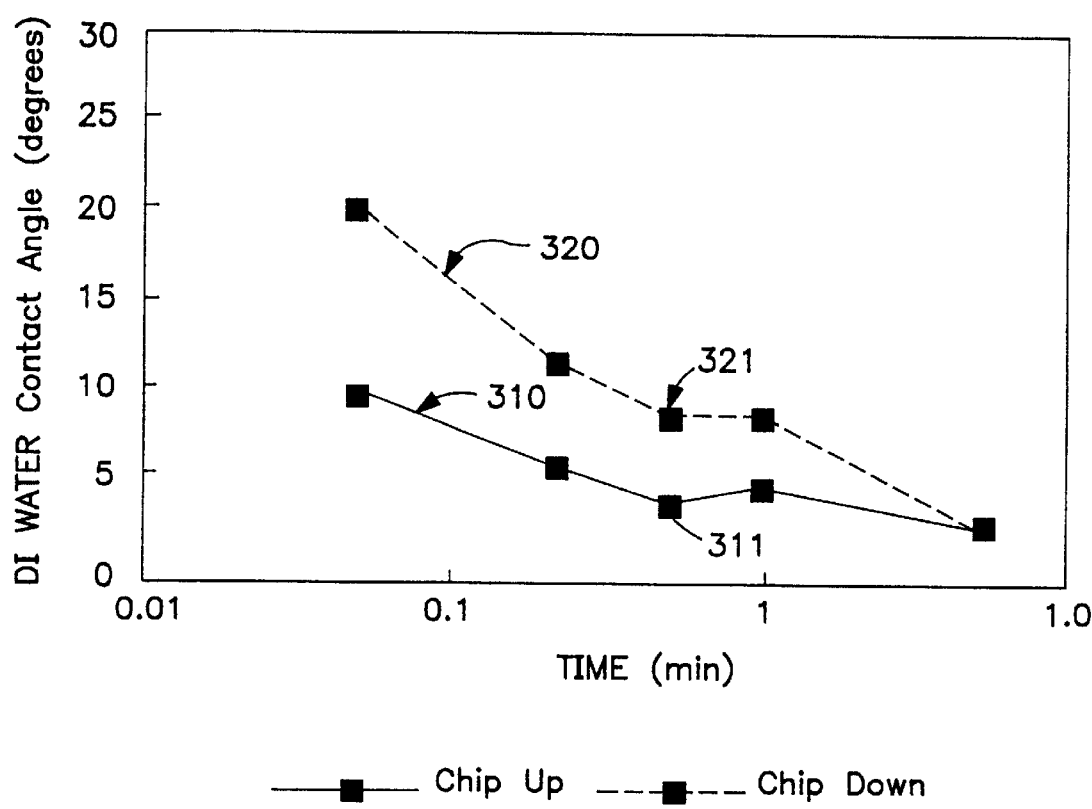
FIG. 3 is a diagram showing the water contact angle on IC chips shown in FIGS. 1A and 2C, having a polyimide passivation layer.

FIG. 3 is a diagram showing how the contact angle varies with the treatment time in the plasma. Curve 320 shows the contact angle for the "chip-down" treatment; within about one minute of the plasma treatment (at point 321), the contact angle reaches a value of about 10 degrees. Curve 310 shows the contact angle for the "chip-up" treatment; within about one minute of the plasma treatment (at point 311), the contact angle reaches a value of about 5 degrees. This indicates that, for one minute of treatment, the chip surface is slightly more hydrophilic after the chip-up treatment. It is likely that the reactive species (primarily atomic oxygen), from the plasma, flow more freely to the substrate in the chip-up configuration. By comparison, the flip-chip assembly that is not treated with the plasma had a contact angle of 73 degrees.

Figure 4:
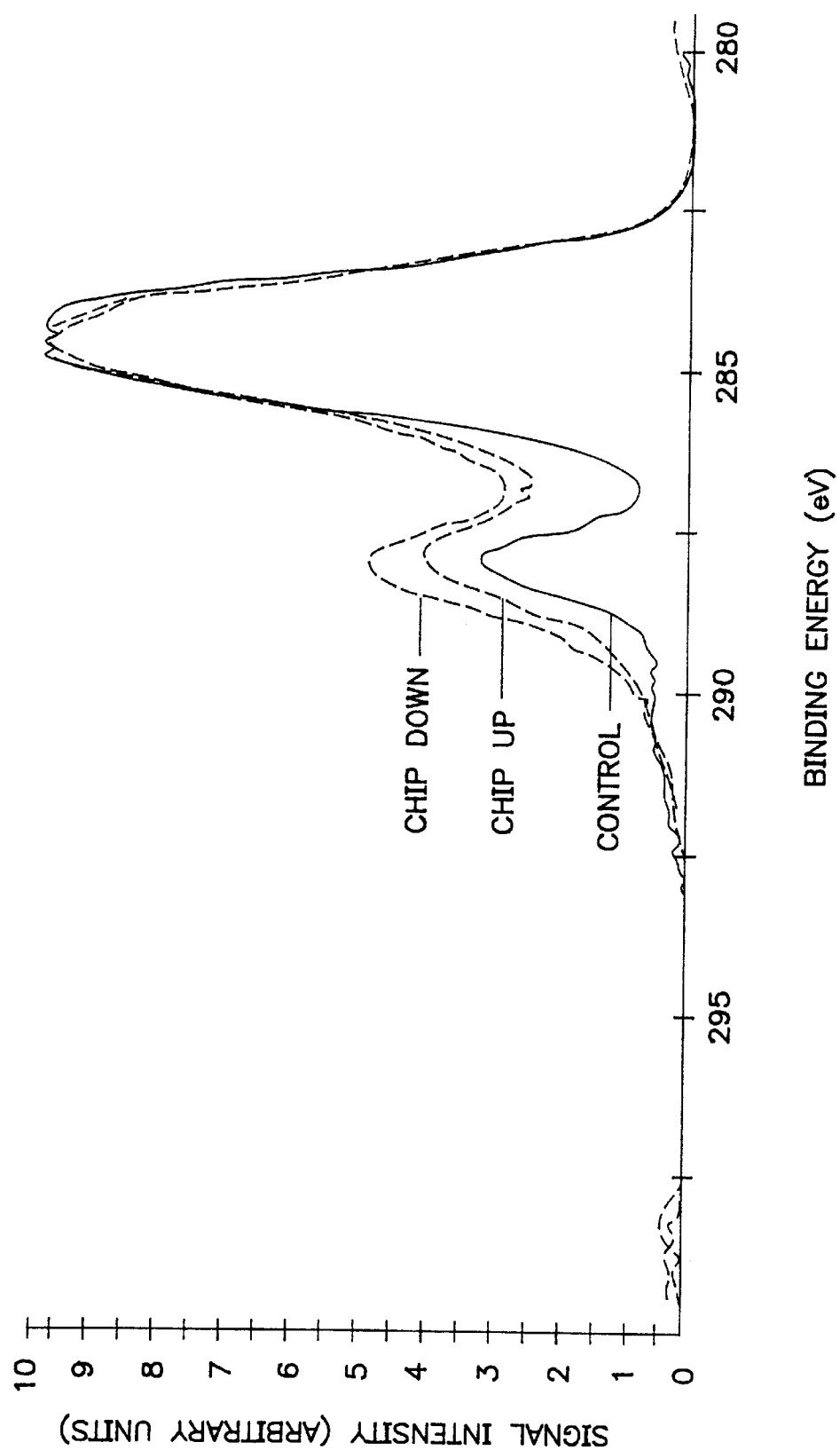
FIG. 4 is a diagram showing high-resolution C1s X-ray photoelectron spectroscopy spectra of the chip surface, for the IC chips shown in FIGS. 1A and 2C, having a polyimode passivation layer.

FIG. 4 is a diagram showing the results of X-ray photoelectron spectroscopy of the chip surface. Both the chip-up and chip-down treatments resulted in substantially higher signal intensity in the 288 eV range. The data in FIG. 4 were measured at the center of the chip and show high resolution C1s XPS spectra.

Figure 5A:
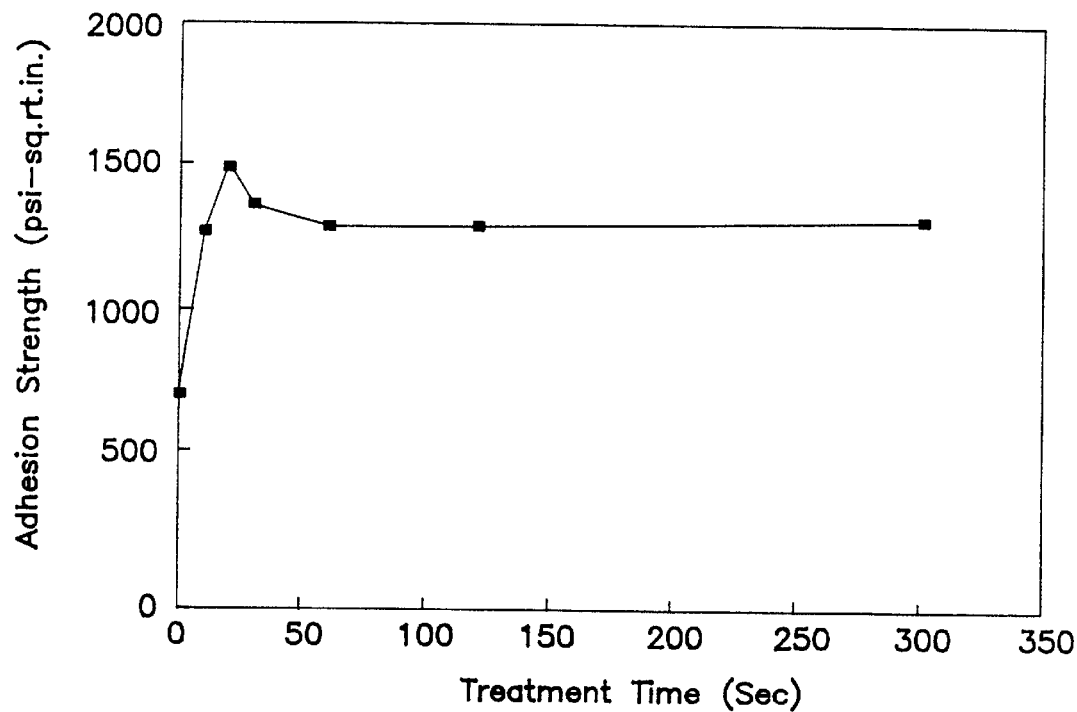
FIGS. 5A and 5B are diagrams showing how the adhesion between the encapsulant and the chip varies as a function of the plasma treatment time.
Figure 5B:
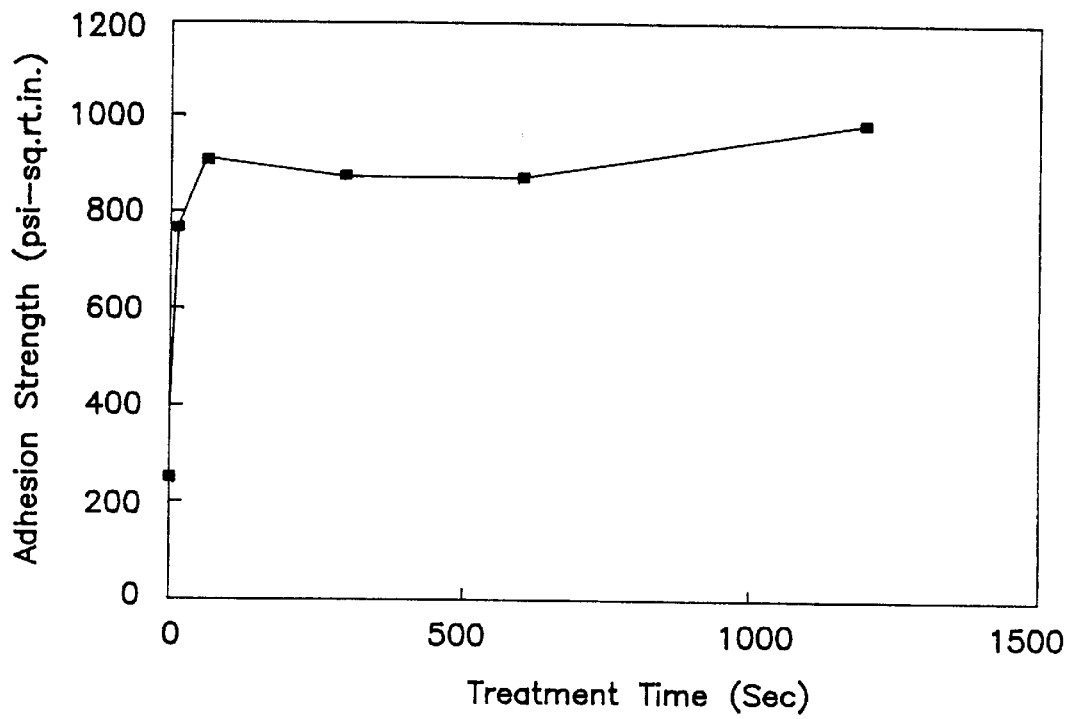

FIGS. 5A and 5B are diagrams showing how the adhesion between the encapsulant and the chip varies as a function of the plasma treatment time. FIG. 5A corresponds to plasma treatment before joining for RIE. FIG. 5B corresponds to plasma treatment after joining for a conventional plasma system (substrate residing on electrically isolated surface). In both FIGS. 5A and 5B, the baseline for a conventional flip-chip fabrication method without plasma is shown along the Y-axis (treatment time=0). In either diagram, with a plasma treatment time of 1–2 minutes, the adhesion improves by a factor of 2 to 3.5 times.

Figure 6:
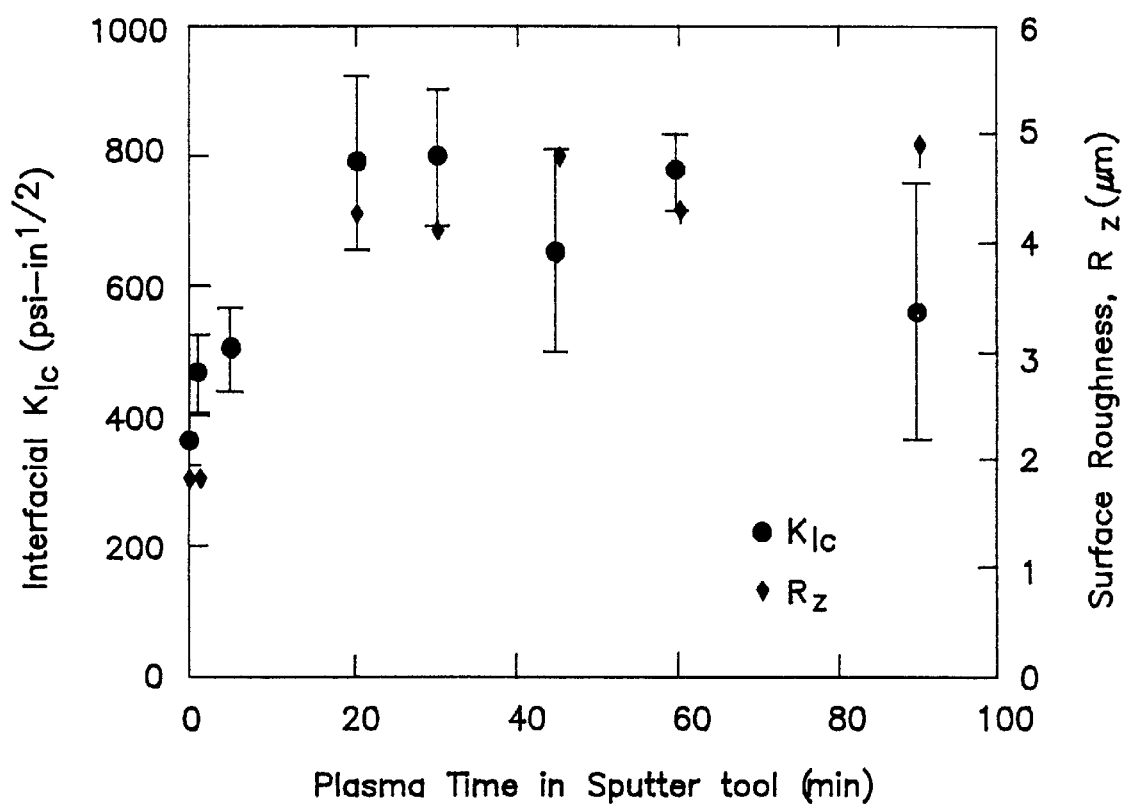
FIG. 6 is a diagram showing the interfacial adhesion strength, $K_{JC}$, and the average surface roughness, $R_Z$, for several plasma treatment times.

FIG. 6 is a diagram showing the interfacial adhesion strength $K_{IC}$ and the average surface roughness $R_Z$ for several plasma treatment times. Even with prolonged plasma treatment, the surface roughness of the polyimide chip surface does not exceed 0.05 μm.

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed is:

1. A flip-chip-on-board assembly, comprising:
    an integrated circuit (IC) chip having an insulation layer with a surface, which has been treated with a plasma to chemically modify the surface of the insulation layer substantially without roughening the surface of the insulation layer, the IC chip having a plurality of electrical contact pads;
    a chip carrier having a surface and a plurality of electrical contacts on the surface of the chip carrier;
    a plurality of solder bumps, each bump electrically connecting one of the plurality of contact pads of the IC chip to a respective one of the contacts of the chip carrier, such that a space is formed between the surface of the insulation layer and the surface of the chip carrier; and
    an underfill encapsulant material filling the space.

2. The flip-chip-on-board assembly according to claim 1, wherein the chip carrier has been treated with the plasma to chemically modify the surface of the chip carrier.

3. The flip-chip-on-board assembly according to claim 1, wherein the insulation layer is formed from a material that includes a hydrocarbon component.

4. The flip-chip-on-board assembly according to claim 1, wherein the insulation layer consists of polyimide.

5. The flip-chip-on-board assembly according to claim 1, wherein the chip carrier includes a laminate covered by the surface of the chip carrier, and the surface of the chip carrier comprises an epoxy resin solder mask having inorganic filler particles.

6. The flip-chip-on-board assembly according to claim 1, wherein the insulation layer is sufficiently smooth so that no roughness is detectable by a s canning electron microscope.

7. The flip-chip-on-board assembly according to claim 1, wherein the plasma is one of the group consisting of $O_2$ plasma and a microwave-generated Ar and $N_2O$ plasma.

* * * * *